(12) United States Patent
Wang et al.

(10) Patent No.: US 9,825,580 B2
(45) Date of Patent: Nov. 21, 2017

(54) METHOD FOR CONSTRUCTING REAL-TIME SOLAR IRRADIATION METERING NETWORK OF GIGAWATTS LEVEL PHOTOVOLTAIC POWER GENERATION BASE

(71) Applicants: State Grid Corporation of China, Beijing (CN); Gansu Electric Power Company of State Grid, Lanzhou (CN); Wind Power Technology Center of Gansu Electric Power Company, Lanzhou (CN); Tsinghua University, Beijing (CN)

(72) Inventors: Ning-Bo Wang, Shenzhen (CN); Liang Lu, Shenzhen (CN); Qing-Quan Lv, Shenzhen (CN); Ying Qiao, Beijing (CN); Zong-Xiang Lu, Beijing (CN); Kun Ding, Beijing (CN); Shi-Yuan Zhou, Beijing (CN); Ding-Mei Wang, Beijing (CN); Ming Ma, Beijing (CN)

( * ) Notice: Subject to any disclaimer, the term of this patent is extended or adjusted under 35 U.S.C. 154(b) by 713 days.

(21) Appl. No.: 14/497,332

(22) Filed: Sep. 26, 2014

(65) Prior Publication Data
US 2016/0092611 A1    Mar. 31, 2016

(51) Int. Cl.
| | | |
|---|---|---|
| *G06F 17/50* | (2006.01) |
| *H02S 10/00* | (2014.01) |
| *H02S 50/00* | (2014.01) |
| *H02S 50/15* | (2014.01) |

(52) U.S. Cl.
CPC ............. *H02S 10/00* (2013.01); *G06F 17/50* (2013.01); *H02S 50/00* (2013.01); *H02S 50/15* (2014.12)

(58) Field of Classification Search
CPC ........................................................ H02S 10/00
USPC ........................................................... 703/1
See application file for complete search history.

(56) References Cited

U.S. PATENT DOCUMENTS

| 4,430,000 A | * | 2/1984 | Eldering | ................... G01J 1/42 |
| | | | | 250/233 |
| 2009/0159113 A1 | * | 6/2009 | Morimoto | .................. F24J 2/38 |
| | | | | 136/244 |
| 2014/0005845 A1 | * | 1/2014 | Thomas | .................. H02J 3/385 |
| | | | | 700/291 |

\* cited by examiner

*Primary Examiner* — Timothy A Mudrick
(74) *Attorney, Agent, or Firm* — The Law Office of Austin Bonderer, PC; Austin Bonderer

(57) ABSTRACT

A method for constructing real-time solar irradiation metering network of gigawatt-level photovoltaic power generation base comprises the following steps: Spatial and temporal distribution characteristics of irradiation quantity of the target area is analyzed based on the historical observation data of the irradiation quantity. The outline location of solar irradiation metering stations is determined by dividing the typical areas where the spatial and temporal distribution characteristics are consistent. The detailed location of solar irradiation metering stations is selected based on the center location distribution of photovoltaic power station clustering. A solar irradiation metering device is constructed on the detailed location of the solar irradiation metering station.

8 Claims, 5 Drawing Sheets

METHOD FOR CONSTRUCTING REAL-TIME SOLAR IRRADIATION METERING NETWORK OF GIGAWATTS LEVEL PHOTOVOLTAIC POWER GENERATION BASE

BACKGROUND

1. Technical Field

The present disclosure relates to a method for constructing real-time solar irradiation metering network of photovoltaic power generation base, especially a method of constructing real-time solar irradiation metering network of gigawatts of photovoltaic power generation base.

2. Description of the Related Art

In order to measure the solar irradiation resource, the real-time metering network construction is essential for planning the solar irradiation resource of the gigawatts photovoltaic power stations, and improving the prediction accuracy of photovoltaic power and theoretical calculation of photovoltaic power.

Currently, the solar irradiation resource monitoring network has been seldom built besides the meteorological utilities. However, the solar irradiation resource monitoring in the meteorological utilities is offline, and the duration of monitoring interval is long. Thus it cannot be applied in improving the accuracy of the short-term prediction and very-short-term prediction of the photovoltaic power generation base.

What is needed, therefore, is a method for constructing real-time solar irradiation metering network in photovoltaic power generation base that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
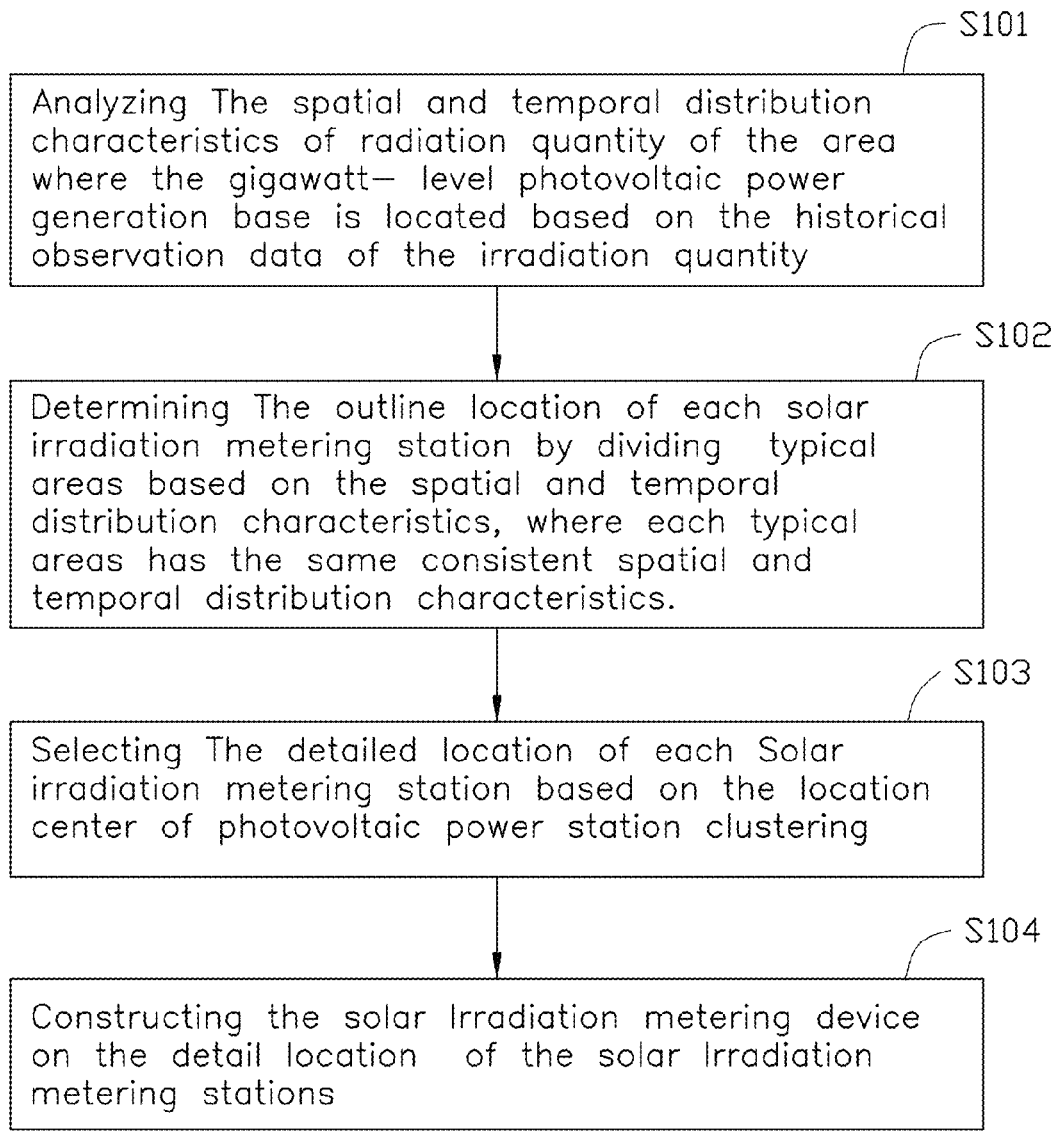
FIG. 1 shows a flow chart of one embodiment of a method for constructing real-time solar irradiation metering network of the gigawatt level photovoltaic power generation base.
Figure 2A:
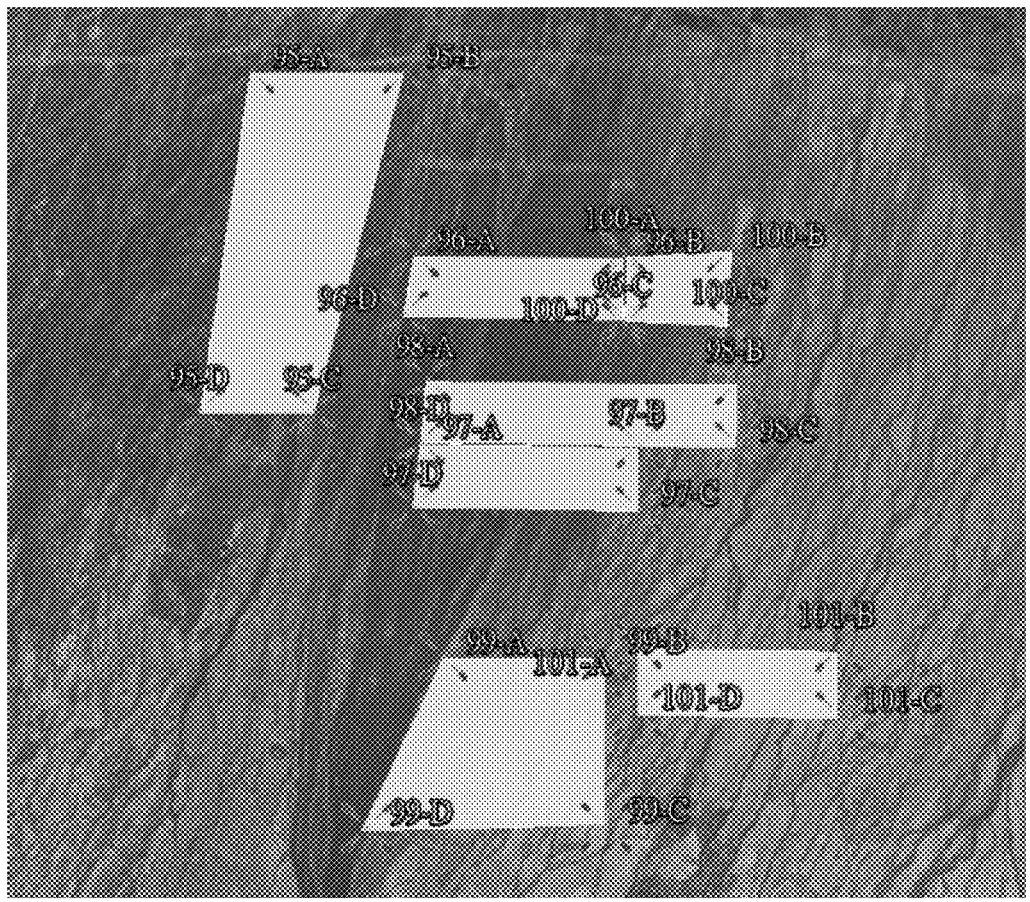
FIGS. 2a-2d shows a schematic view of the clustering of photovoltaic power generation base groups.
Figure 2B:
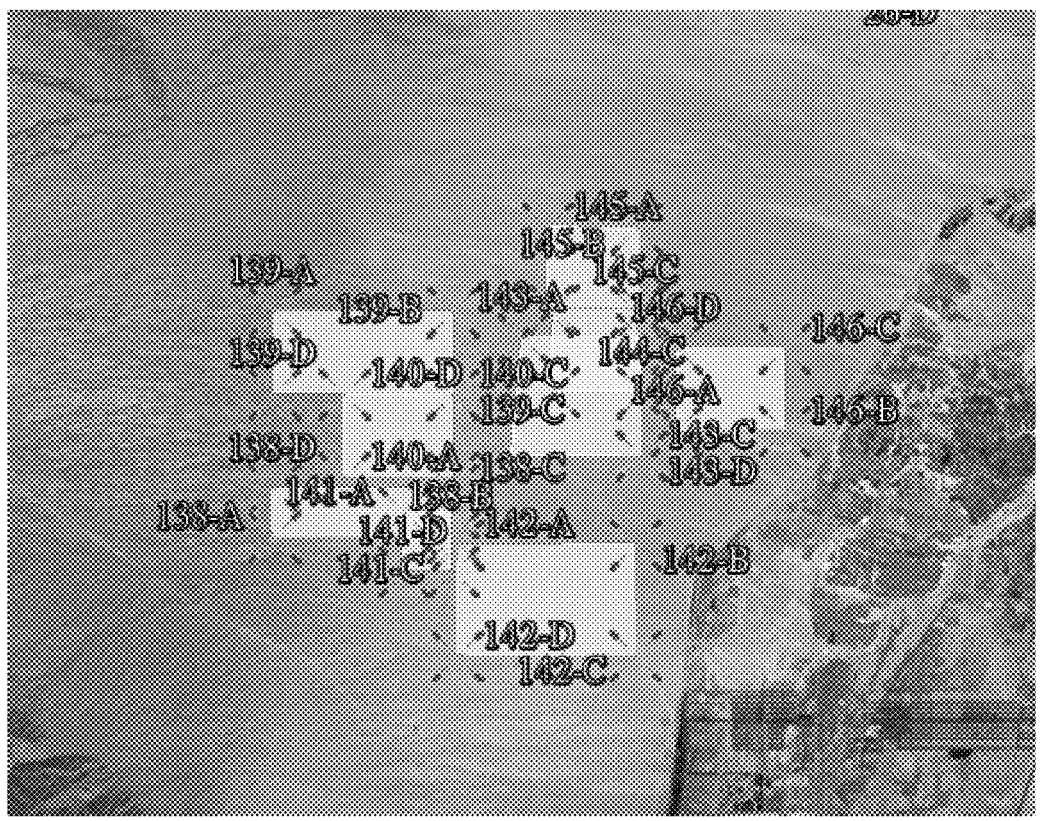
Figure 2C:
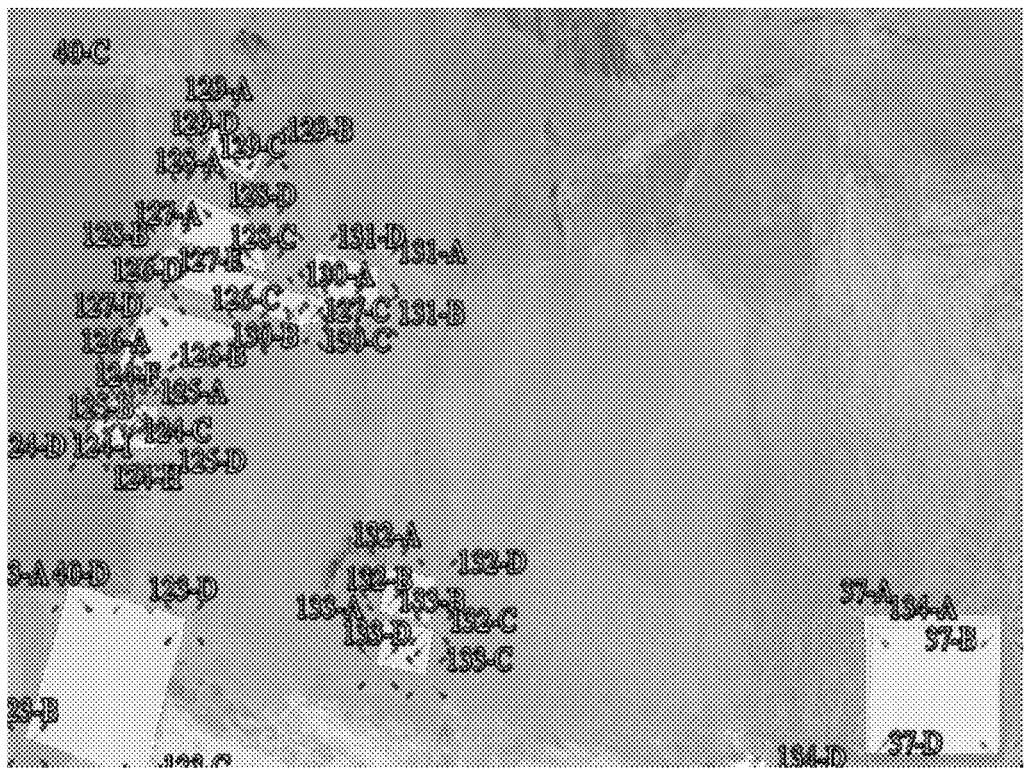
Figure 2D:
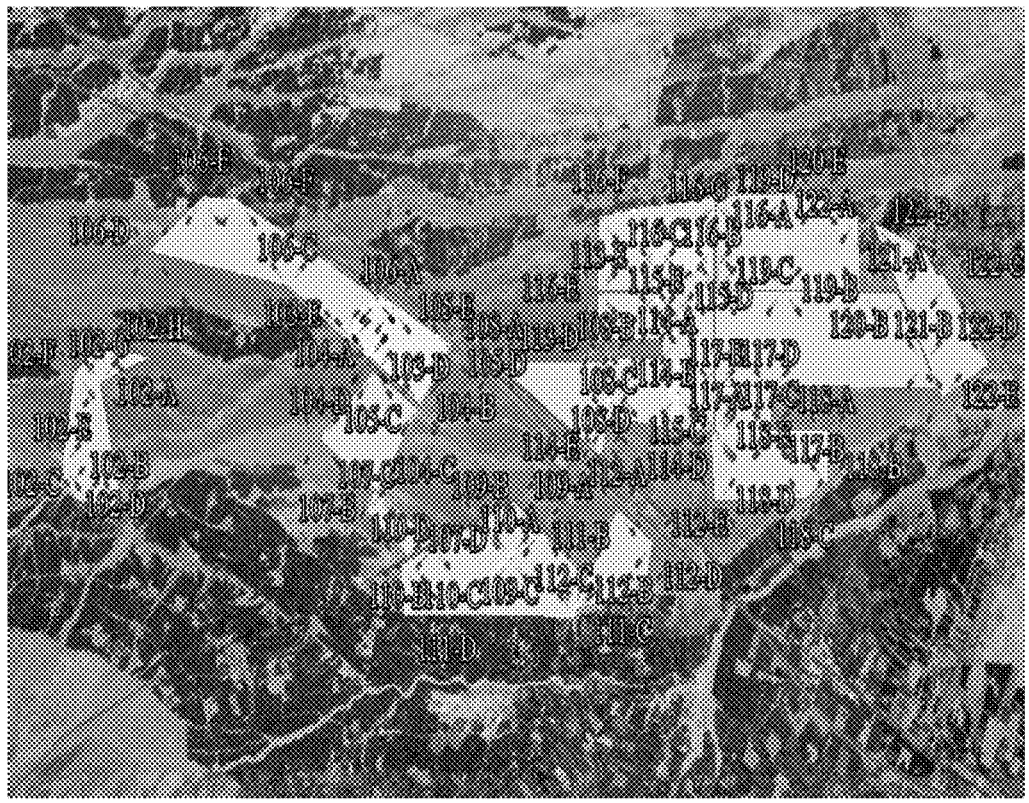

Referring to FIG. 1, a method of constructing real-time solar irradiation metering network of the gigawatt-level photovoltaic power generation base with a cluster of photovoltaic power stations comprises following steps:

step (S100), analyzing spatial and temporal distribution characteristics of irradiation quantity of the area where the gigawatt level photovoltaic power generation base is located based on the observation data of the radiation quantity;

step (S101), determining the outline of the locations of solar irradiation metering stations by dividing the cluster into typical areas based on the spatial and temporal distribution characteristics, where the spatial and temporal distribution characteristics of radiation are consistent in each of the typical area;

step (S102), determining the detailed location of solar irradiation metering stations by finding the center of the photovoltaic power station cluster;

step (S103), locating an solar irradiation metering device on the center of the photovoltaic power station cluster.

In step (S101), the outline location of the cluster of solar irradiation metering stations can be determined by:

step (b1), calculating an average of the historical observation data of the solar irradiation quantity from the existing weather station nearby the gigawatt-level photovoltaic power generation base, and analyzing the spatial and temporal distribution characteristics of an average of radiation quantity in a year;

step (b2), constructing a regional irradiation quantity matrix and obtaining a dimensional sequence by analyzing the regional irradiation quantity matrix with the Principal component Analysis (PCA), where the regional irradiation quantity matrix comprises a vertical axis representing a spatial data of the observation data and a horizontal axis representing temporal data of the observation data.

In step (b1), the observation data of the irradiation quantity can be accumulated for more than 30 years with the existing weather stations near the gigawatts-level photovoltaic power generation base.

In step (b2), analyzing the regional irradiation quantity matrix with the Principal component Analysis that comprises:

step (b21), constructing the regional irradiation quantity matrix T with the special data and temporal data of the observation data:

$$\overline{T} = \begin{pmatrix} t_{11} & t_{12} & \cdots & t_{1n} \\ t_{21} & t_{22} & \cdots & t_{2n} \\ \cdots & \cdots & \cdots & \cdots \\ t_{m1} & t_{m2} & \cdots & t_{mn} \end{pmatrix}, \quad (1)$$

where m represents the number of solar irradiation metering stations, and n represents the number of time series;

step (b22), shifting the regional irradiation quantity matrix T by deducting the regional irradiation quantity matrix T with its mean matrix M, $$T = \overline{T} - M = t_{ij} - m_i \quad (2)$$

where $$m_i = \frac{1}{n}\sum_{j=1}^{n} t_{ij},$$

$1 \le i \le m$, $1 \le j \le n$;

step (b23), calculating a crossed product $C_{m \times m}$ between the regional irradiation quantity matrix T and a transpose matrix of the regional irradiation quantity matrix T:

$$C_{m \times m} = \frac{1}{n}TT^T \quad (3)$$

where the crossed product $C_{m \times m}$ is a covariance matrix;

step (b24), calculating eigenvalues ($\lambda_1, \lambda_2, \ldots \lambda_m$) and eigenvector matrix $V_{m \times m}$ of the covariance matrix $C_{m \times m}$, where the eigenvalues ($\lambda_1, \lambda_2, \ldots \lambda_m$) and the eigenvector matrix $V_{m \times m}$ satisfy:

$$C_{m \times m} V_{m \times m} = V_{m \times m} \Lambda_{m \times m} \qquad (4),$$

where $\Lambda_{m \times m}$ is a diagonal matrix composed of the eigenvalues $\lambda_1, \lambda_2, \ldots \lambda_m$, $$\Lambda = \begin{pmatrix} \lambda_1 & 0 & \ldots & 0 \\ 0 & \lambda_2 & \ldots & 0 \\ \ldots & \ldots & \ldots & \ldots \\ 0 & 0 & \ldots & \lambda_m \end{pmatrix},$$

and the eigenvalues $\lambda_1, \lambda_2, \ldots \lambda_m$ are arranged in a descending order, that is $\lambda_1 > \lambda_2 > \ldots > \lambda_m$. Because the regional irradiation quantity matrix T is composed of the observation data, thus the eigenvalues $\lambda_1, \lambda_2, \ldots \lambda_m$ are greater than zero. Each of the eigenvalues $\lambda_1, \lambda_2, \ldots \lambda_m$ is correspond to one of the eigenvectors $V_{m \times m}$.

step (b25), obtaining PCA components $P_{m \times n}$ of the eigenvectors $V_{m \times m}$ by projecting the eigenvectors $V_{m \times m}$ on the regional irradiation quantity matrix T:

$$P_{m \times n} = V_{m \times m}^T T_{m \times n} \qquad (5)$$

where $P_{m \times n}$ is a time coefficient matrix with m rows and n columns. The data on each rows of the time coefficient matrix $P_{m \times n}$ is corresponding to time coefficients of each of the eigenvectors $V_{m \times m}$.

From the calculation above, the regional irradiation quantity matrix T can be reconstructed through the eigenvectors $V_{m \times m}$ and the PCA components $P_{m \times n}$. Furthermore, the regional irradiation quantity matrix T can also be reconstructed through a cluster of larger principle components selected from the PCA components $P_{m \times n}$.

Thus the outline locations of the solar irradiation metering stations can be selected by:

step (b251), selecting the largest components;

step (b252), performing rotated principal component analysis;

step (b252), determining the typical areas by setting an appropriate threshold, where the components of the spatial and temporal distribution of the irradiation quantity are consistent in the same area.

According to the reconstruction nature of PCA, the regional irradiation quantity matrix $T_{m \times n}$ of the observation data with m solar irradiation metering stations and n observation samples can be decomposed by multiplying the eigenvectors $V_{m \times n}$ with the weighting coefficient $U_{n \times m}$ of the eigenvectors:

$$T_{m \times n} = V_{m \times n} U_{n \times m} \qquad (6),$$

where each column in the eigenvector matrix $V_{m \times n}$ comprises m normalized eigenvectors, and the weighting coefficient $U_{n \times m}$ represents the time coefficient.

The eigenvectors $V_{m \times n}$ and the weighting coefficient $U_{n \times m}$ can be rotated with varimax rotation. The p larger principle components can be selected, so that the variance S of the weighting coefficient $U_{n \times m}$ is maximum after being rotated:

$$S^2 = \frac{1}{m^2} \left[ m \sum_{j=1}^{p} \sum_{i=1}^{n} \left( \frac{v_{ij}}{\sum_{j=1}^{p} v_{ij}^2} \right) - \sum_{j=1}^{p} \sum_{i=1}^{n} \left( \frac{v_{ij}^2}{\sum_{j=1}^{p} v_{ij}^2} \right) \right] \qquad (7)$$

After the PCA, each eigenvector represents the distribution of the spatial correlation of the irradiation quantity, and the spatial correlation between the areas can be dramatically reduced. The changes of time coefficient are focused on the large principle components, and the projection coefficient on other components will nearly be zero. If the signs (positive or negative) of the components of the eigenvector in the areas are consistent, the climatic change in these area is thought to be consistent. By setting appropriate threshold, the areas with the same consistent irradiation quantity will be determined as the typical area. In one embodiment, the threshold is set as 0.6. The solar irradiation metering station can be constructed in this typical area.

In step (S102), the detailed location of the solar irradiation metering station can be determined based on the following factors, such as the distance between the solar irradiation metering station and the photovoltaic powers station, and whether the condition of the target area is suitable for construction.

Referring to FIGS. 2a-2d, the detailed location of the solar irradiation metering station can be determined by following:

step (a1), obtaining the global position system (GPS) coordinate of the center of the photovoltaic power station, where the GPS coordinate is taken as the location coordinate of the photovoltaic power station;

step (a2), getting the outline locations of the solar irradiation metering stations by the clustering method;

step (a3), forming photovoltaic power station groups by the location coordinates of the photovoltaic power station;

step (a4), taking the center of each cluster of photovoltaic power station group as the detailed location of the solar irradiation metering station.

In step (a1), the GPS coordinate of the center of the photovoltaic power station can be obtained by the GPS coordinate around the photovoltaic power station. In one embodiment, the photovoltaic power station is in a shape of quadrilateral. Thus the GPS coordinate of the center can be determined by the GPS coordinate of four corners of the photovoltaic power station.

In step (a2), the outline locations of the solar irradiation metering stations can be obtained by:

step (a21), selecting k macroscopic locations of the photovoltaic power stations as initial clustering center locations arbitrarily;

step (a22), calculating the distance between the location coordinate of the photovoltaic power station and the initial clustering center in each area, and dividing the distances based on minimum distance method;

step (a23), recalculating the center location of each cluster which has been changed;

step (a24), stopping recalculation until the change of the clustering center location is smaller than the settled threshold, otherwise going to step (a22).

In step (S103), the solar irradiation metering station comprises sensors, data acquisitions, communication equipments, power system, and other auxiliary equipments. The elements to be monitored comprises wind speed, wind direction, temperature, humidity, barometric pressure, total irradiation, reflected irradiation and component temperature. The range of operating temperature of all devices in the solar irradiation metering station should be within about −40 to about +60 in the Gobi desert wilderness environment.

Furthermore, in order to monitoring the solar irradiation source, a real-time data acquisition device can be equipped in the solar irradiation metering station. The real-time data acquisition device should meet the following requirements:

(a) the system transmission flow rate is equal to or greater than 98%;
(b) the continuous working time without sunshine is equal to or greater than 15 days;
(c) it can store the amount of data of more than three months;
(d) being placed in the protective case with wind resistance, rain resistance, and corrosion resistance;
(e) can transmit real-time data in the minute level, is low in power consumption, and suitable for the unattended field work.

The method of constructing real-time solar irradiation metering network of gigawatt-level photovoltaic power generation base has following advantages. Both the macroscopic impact of large-scale climate features and the microscopic impact of the location of the photovoltaic power generation stations on the solar irradiation metering station are considered. If the macroscopic radiate quantity is consistence, the microscopic location of the solar irradiation metering station can be selected according to the distance between the solar irradiation metering station and the photovoltaic power station. The method of constructing real-time solar irradiation metering network of the gigawatt-level photovoltaic power generation base has the advantages of good real-time performance, small monitoring time interval, and capability of ensuring the data supporting for more precise photovoltaic generated power forecasting.

Depending on the embodiment, certain of the steps of methods described may be removed, others may be added, and that order of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A method for constructing real-time solar irradiation metering network of a gigawatt-level photovoltaic power generation base, the method comprising:
    analyzing spatial and temporal distribution characteristics of irradiation quantity of an area, wherein the gigawatt-level photovoltaic power generation base is located based on the historical observation data of the irradiation quantity;
    determining an outline location of each solar irradiation metering stations by dividing typical areas based on the spatial and temporal distribution characteristics, wherein the spatial and temporal distribution characteristics of irradiation are consistent in the same areas;
    selecting a detailed location of each solar irradiation metering stations based on an location center of photovoltaic power station clustering; and
    constructing an solar irradiation metering device on each detailed location of the solar irradiation metering stations.

2. The method of claim 1, wherein the observation data of the irradiation quantity is accumulated for more than 30 years with the cluster of weather station around the gigawatt level photovoltaic power generation base.

3. The method of claim 1, wherein the detailed location of the solar irradiation metering stations is selected by:
    selecting the largest principle components;
    performing a rotated principal component analysis to the cluster of larger principle components; and
    determining typical areas by setting an appropriate threshold, wherein the spatial and temporal distribution characteristics of the irradiation quantity in each of the typical areas are consistent.

4. The method of claim 1, wherein the regional irradiation quantity matrix $T_{m \times n}$ of the observation data with m solar irradiation metering stations and n observation samples is decomposed by multiplying the eigenvectors $V_{m \times n}$ with the weighting coefficient $U_{n \times m}$ of the eigenvectors:

$$T_{m \times n} = V_{m \times n} U_{n \times m},$$

wherein each column in the eigenvectors $V_{m \times n}$ comprises m normalized eigenvectors, and the weighting coefficient $U_{n \times m}$ represents the time coefficient.

5. The method of claim 4, wherein the p largest principle components are selected, so that the variance S of the weighting coefficient $U_{n \times m}$ is maximum after being rotated:

$$S^2 = \frac{1}{m^2}\left[m\sum_{j=1}^{p}\sum_{i=1}^{n}\left(\frac{v_{ij}}{\sum_{j=1}^{p} v_{ij}^2}\right) - \sum_{j=1}^{p}\sum_{i=1}^{n}\left(\frac{v_{ij}^2}{\sum_{j=1}^{p} v_{ij}^2}\right)\right].$$

6. The method of claim 1, wherein the detailed location of the solar irradiation metering station is determined by following:
    obtaining a GPS coordinate of the center of the photovoltaic power station, wherein the GPS coordinate of the center of the photovoltaic power station is taken as the location coordinate of the photovoltaic power station;
    getting the outline locations of the solar irradiation metering stations by the clustering method;
    forming the photovoltaic power stations by clustering the location coordinates of the photovoltaic power station; and
    taking a center of each photovoltaic power station group as the detailed location of the solar irradiation metering station.

7. The method of claim 6, wherein the outline locations of the solar irradiation metering stations is obtained by:
    step (a21), selecting k macroscopic locations of the photovoltaic power stations as an initial clustering center locations arbitrarily;
    step (a22), calculating a distance between the location coordinate of the photovoltaic power station and the initial clustering center in each area based on GPS location, and dividing the distances based on the minimum distance method;
    step (a23), recalculating each clustering center location which has been changed; and
    step (a24), stopping recalculation until the change of the clustering center location is smaller than the settled threshold, otherwise going to step (a22).

8. The method of claim 7, wherein a real-time data acquisition device is equipped in the solar irradiation metering station, and the real-time data acquisition device meets following requirements:

(a) a system transmission flow rate is equal to or greater than 98%;
(b) a continuous working time without sunshine is equal to or greater than 15 days;
(c) being capable of storing a mount of data of more than three months;
(d) being placed in a protective case with wind resistance, rain resistance, and corrosion resistance; and
(e) being capable of transmitting real-time data in a minute level.

* * * * *